(12) United States Patent
Chabinyc et al.

(10) Patent No.: US 6,921,679 B2
(45) Date of Patent: Jul. 26, 2005

(54) ELECTRONIC DEVICE AND METHODS FOR FABRICATING AN ELECTRONIC DEVICE

(75) Inventors: Michael L Chabinyc, Mountain View, CA (US); Alberto Salleo, San Francisco, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 12 days.

(21) Appl. No.: 10/739,189

(22) Filed: Dec. 19, 2003

(65) Prior Publication Data

US 2005/0133788 A1 Jun. 23, 2005

(51) Int. Cl.$^7$ ............................................... H01L 21/00
(52) U.S. Cl. ......................................... 438/48; 438/149
(58) Field of Search ........................... 438/48, 82, 149, 438/151; 257/40, 57, 59, 72

(56) References Cited

U.S. PATENT DOCUMENTS

| | | | |
|---|---|---|---|
| 5,017,989 A | | 5/1991 | Street et al. |
| 5,055,899 A | * | 10/1991 | Wakai et al. .................. 257/61 |
| 6,284,558 B1 | * | 9/2001 | Sakamoto .................... 438/30 |
| 6,545,291 B1 | | 4/2003 | Amundson et al. |
| 6,639,281 B2 | | 10/2003 | Kane et al. |
| 6,774,393 B2 | * | 8/2004 | Murti et al. .................. 257/40 |
| 2003/0027082 A1 | | 2/2003 | Wong et al. |
| 2003/0134516 A1 | | 7/2003 | Wong et al. |

OTHER PUBLICATIONS

Street et al., "Contact effects in polymer transistors," Applied Physics Letters, vol. 81, No. 15, Oct. 7, 2002.

Necliudov et al., "Modeling of organic thin film transistors of different designs," Journal of Applied Physics, vol. 88, No. 11, Dec. 1, 2000.

Paul et al., "Additive jet printing of polymer thin–film transistors," Applied Physics Letters, vol. 83, No. 10, Sep. 8, 2003.

Wong et al., "Amorphous silicon thin–film transistors and arrays fabricated by jet printing," Applied Physics Letters, vol. 80, No. 4, Jan. 28, 2002.

Chabinyc et al., "Fabrication of Arrays of Organic Polymeric Thin–Film Transistors Using Self-Aligned Microfluidic Channels," Advanced Materials, 15, No. 22, Nov. 17, 2003.

\* cited by examiner

*Primary Examiner*—Phat X. Cao
*Assistant Examiner*—Theresa T. Doan
(74) *Attorney, Agent, or Firm*—Oliff & Berridge, PLC

(57) ABSTRACT

An electronic device and a method of fabricating the electronic device includes forming a first electrical contact, a dielectric layer and a second electrical contact wherein the dielectric layer is located between the first and the second electrical contacts, forming an electrically insulating layer over the dielectric layer and the first electrical contact, exposing the first and second electrical contact, the dielectric layer and a first portion of the electrically insulating layer to radiation from the side of the first electrical contact, removing a second portion of the electrically insulating layer that was not irradiated by the radiation, providing a semiconductor material over a portion of the dielectric layer, and forming at least a third electrical contact over at least a portion of the electrically insulating layer and the semiconductor material.

9 Claims, 7 Drawing Sheets

ELECTRONIC DEVICE AND METHODS FOR FABRICATING AN ELECTRONIC DEVICE

BACKGROUND OF THE INVENTION

1. Field of Invention

This invention relates to electronic devices such as, for example, transistors and methods for fabricating the same.

2. Description of Related Art

Electronic devices, such as, for example, transistors, have a multitude of uses. For example, low cost, large area arrays of thin-film transistors (TFTs) are important components in flat panel displays, electric paper, and imagers. In a pixel of a display, a TFT is used as an electrical switch to charge a pixel electrode that switches the display media from one state to another. A display backplane comprises an array of pixel elements that is used to address the display media. Amorphous silicon is often used as the active material in TFTs for these applications.

Polymeric semiconductors have field effect mobilities of approximately $0.01–0.1$ $cm^2V^{-1}s^{-1}$ and are relatively simple to process due to their solubility and ease of forming continuous films. These field effect mobilities are typically lower than those obtained for amorphous silicon, $\sim 0.5–1.0$ $cm^2V^{-1}s^{-1}$.

Additive and subtractive patterning techniques are sometimes used to fabricate patterned polymeric TFTs. Additive methods deposit only enough material for the desired pattern while subtractive methods deposit a blanket layer of material and remove the majority of it to define the pattern. Two subtractive methods for organic TFTs include photolithography and screen printing. Photolithography is a high-resolution, subtractive method for patterning, and is sometimes used to make complex circuits and displays with organic materials. An additive method sometimes used for fabrication of organic light emitting diodes, metal-organic-metal diodes, and TFTs is inkjet printing. Inkjet printing sometimes maintains registration by digital-image processing and precise spatial control of deposition.

Generally, in a transistor, the source pad and the drain pad are configured in coplanar geometry. That is, the source pad and the drain pad are positioned over the gate electrode and under the semiconductor. Also, the source pad and the drain pad are sometimes configured in a staggered geometry. That is, the source and the drain pad are located over the semiconductor.

SUMMARY OF THE INVENTION

The use of organic semiconductors can have advantages over amorphous silicon, especially for flexible electronics. Organic semiconductors are sometimes processed using low-cost techniques, are sometimes deposited at the low temperatures (e.g., lower than 150° C.) required for plastic substrates, and tolerate mechanical stress. The development of micron-scale processing techniques for organic semiconductors is also beneficial.

The use of organic semiconductors in TFTs in backplanes for displays is limited by their lower field effect mobility relative to amorphous silicon semiconductors. A TFT in a pixel element in a backplane provides current to place charge on a pixel electrode that causes a change in the display at that pixel. The existence of injection barriers at the contacts of organic TFTs can limit the maximum possible output current of the device and thus increases the time needed to place charge on the pixel electrode. In order to solve this problem, and to achieve the current required to charge a pixel electrode in a typical display, the electronic device, such as, for example, the transistor, is enlarged. This enlargement decreases the fill factor of the pixel in the display because of the increase in spatial area of the TFT in the pixel element.

The output current of the some organic electronic devices, such as, a thin film transistor, depends on the geometry of the device due to the presence of injection barriers at the source and drain contacts. Devices with staggered geometries can have larger output currents than devices with coplanar geometries due to decreased contact resistances. However, the manufacturing of devices with coplanar geometries is easier than the manufacturing of devices with staggered geometries, and is preferred for display applications.

Another problem commonly associated with organic devices such as, for example, transistors, is the type of material used as a via layer. The via layer reduces capacitive coupling between the addressing electrodes and the display media. Some via layers require processing steps, such as high temperature or reactive ion etching. These processing steps can damage the organic semiconductor.

In various exemplary embodiments of the devices and methods according to this invention, an organic electronic device is fabricated in a geometry to reduce the injection barrier at a contact. This allows a higher possible output current of the device.

Various separable exemplary embodiments of the devices and methods according to this invention have one staggered contact. This allows for a larger output current without necessarily enlarging the TFT. Thus, the quality of the image on the display experiences reduced degradation.

In various separable exemplary embodiments of the methods and devices according to this invention, an thin film transistor includes a gate electrode, a drain electrode, a source electrode, a via layer, an encapsulant, and a gate dielectric layer on the gate electrode, wherein the source and drain electrodes are over the gate dielectric layer, and wherein a semiconductor is in a recess of the via layer and is over the gate dielectric layer, and either the source or the drain electrode depending on the electrical biases used to drive the TFT.

In various separable exemplary embodiments of the methods and devices according to this invention, a semiconductor is formed in a recess of a via layer by printing, a drain pad is a metal electrode formed over a portion of the via layer, and an encapsulant is over the semiconductor.

In various separable exemplary embodiments of the methods and devices according to this invention, an encapsulant planarizes the electronic device.

In various separable exemplary embodiments of the devices and methods according to this invention, the electronic device includes an organic thin-film semiconductor.

In various separable exemplary embodiments of the devices and methods according to this invention, the via layer has a tapered side.

In various separable exemplary embodiments of the devices and methods according to this invention, a gate electrode, a dielectric layer and a source pad are formed wherein the dielectric layer is between the source pad and the gate electrode.

In various separable exemplary embodiments of the devices and methods according to this invention, a via layer is over a dielectric layer and a gate electrode.

In various separable exemplary embodiments of the devices and methods according to this invention, the electronic device is exposed to radiation from a gate electrode side.

In various separable exemplary embodiments of the devices and methods according to this invention, a portion of the via layer that was not irradiated is removed.

In various separable exemplary embodiments of the devices and methods according to this invention, a semiconductor is formed on a portion of a dielectric layer that is not covered by a via layer.

In various separable exemplary embodiments of the devices and methods according to this invention, a mask is formed over a source pad and a portion of a semiconductor.

In various separable exemplary embodiments of the devices and methods according to this invention, a metal electrode is formed over a via layer, a semiconductor and a mask, and the mask and metal over the mask is removed.

In various separable exemplary embodiments of the devices and methods according to this invention, a semiconductor is printed on a portion of a dielectric layer that is not covered by a via layer.

In various separable exemplary embodiments of the devices and methods according to this invention, a via layer is formed with a tapered edge.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of devices and methods according to this invention will be described in detail with reference to the following figures, wherein.

DETAILED DESCRIPTION OF EXEMPLARY EMBODIMENTS

Figure 1:
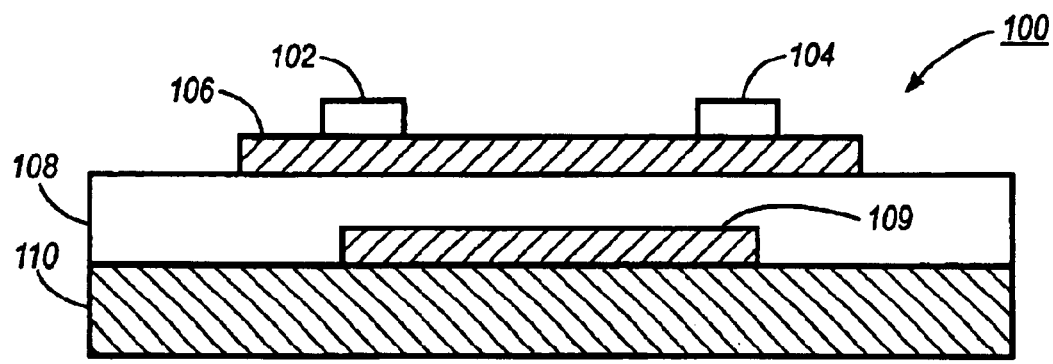
FIGS. 1–3 are cross sections of electronic devices.
Figure 2:
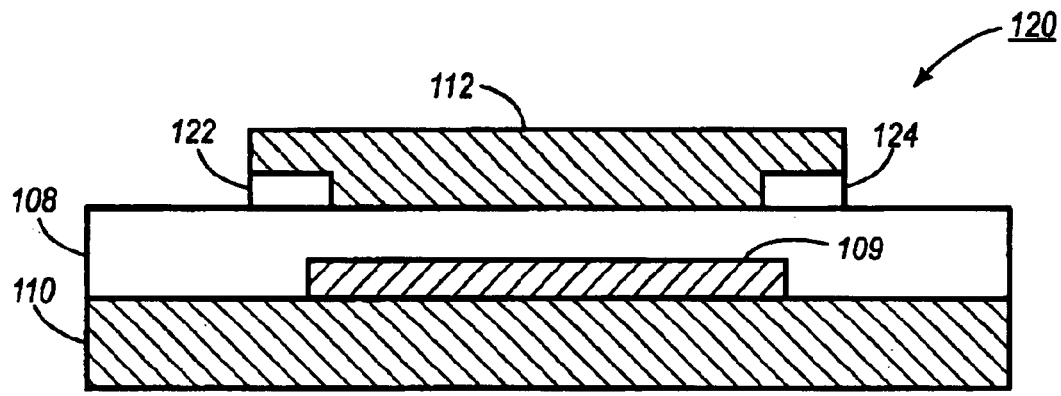
Figure 3:
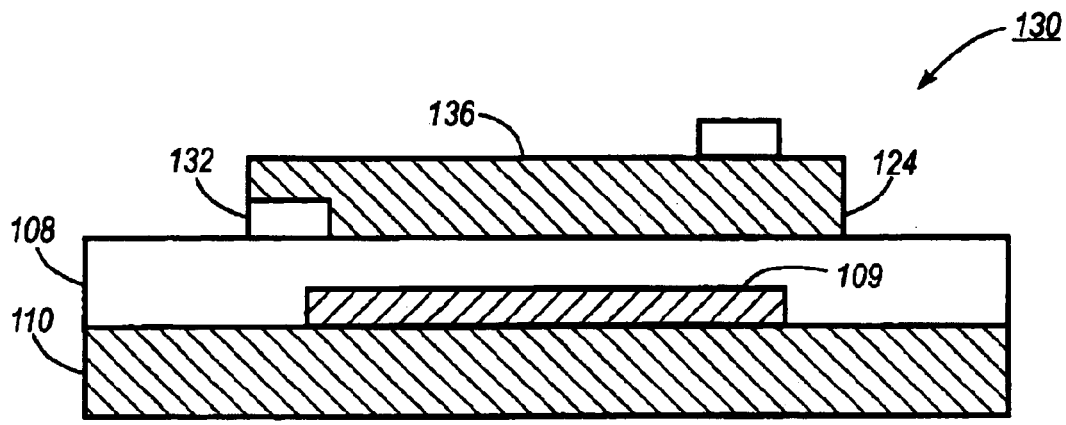

FIGS. 1–3 show illustrations of electronic devices 100, 120 and 130. A dielectric layer 108 is formed over a substrate 110 and over a gate electrode 109, and a semiconductor 106 is formed over the dielectric layer 108. In FIG. 1, an electrode 102 and an electrode 104 are located over the semiconductor 106. In FIG. 2, an electrode 122 and an electrode 124 are located between the semiconductor 112 and the substrate 110. In FIG. 3, an electrode 132 is located between the semiconductor 136 and the gate electrode 110, and an electrode 134 is located over the semiconductor 136. When electrode 102 and the electrode 104 are located over the semiconductor 106, such as in FIG. 1, for example, the electronic device 100 is said to be in a staggered configuration. When the electrode 122 and the electrode 124 are located between the semiconductor 112 and the gate electrode 110, as in FIG. 2, for example, the electronic device 120 is said to have a coplanar configuration. When the electrode 132 is located between the semiconductor 136 and the gate electrode 110, as in FIG. 3, for example, the electronic device 130 is said to have a hybrid configuration.

Typically, devices with staggered geometries, such as FIG. 1, for example, can have larger output currents than devices with coplanar geometries, such as FIG. 2. However, an electronic device 120 with a coplanar configuration, such as FIG. 2, for example, is sometimes easier to manufacture than an electronic device 100 with staggered configurations, such as FIG. 1, for example. Thus, an electronic device 120 with a coplanar configuration, such as FIG. 2, is sometimes enlarged to compensate for the lower effective mobility. The enlargement of a coplanar electronic device 120 at a pixel reduces a fill factor of the pixel, thus degrading the image of the display.

Figure 4:
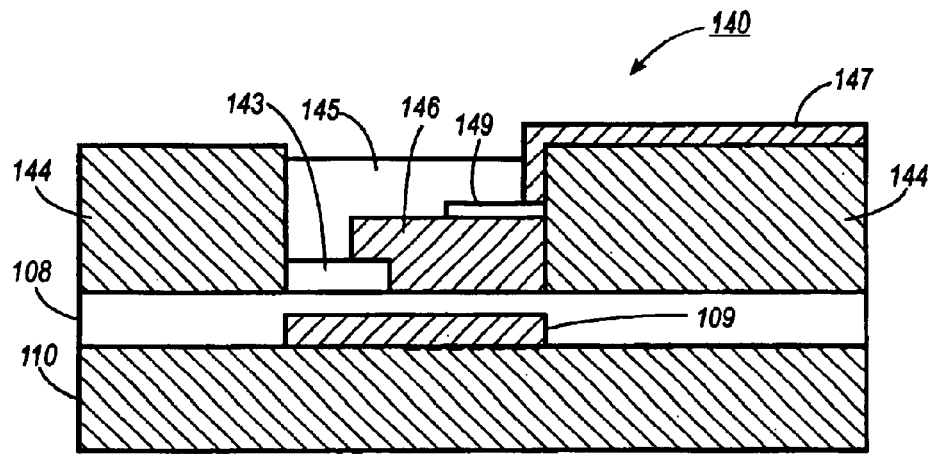
FIG. 4 is a cross section of an exemplary embodiment of an electronic device according to this invention.

FIG. 4 is a cross section of an exemplary embodiment of an electronic device according to this invention. Some of the elements in this figure are commonly numbered with elements previously discussed in connection with other figures. A duplicative discussion of those elements is omitted for the sake of simplicity.

An electronic device 140 has a hybrid, i.e., both coplanar and staggered, configuration. Thus, in various exemplary embodiments, an electrode 143 is formed over the dielectric layer 108, and a semiconductor 146 is formed over a portion of the electrode 143 and over a portion of the dielectric layer 108.

In various exemplary embodiments of the devices and methods according to this invention, a solution processable semiconductor 146 is printed over a portion of the electrode 143 and the dielectric layer 108. In various exemplary embodiments of the devices and methods according to this invention, an electrode 147 is a metallic electrode formed over a portion of a via layer 144 and in electrical contact with an electrode 149 which is located over the semiconductor 146. In various exemplary embodiments of the devices and methods according to this invention, the electrode 147 and the electrode 149 are made from the same material and form a continuous single electrode. In various exemplary embodiments of the devices and methods according to this invention, the electrode 147 and the electrical contact 149 are made from a different material and are thus physically distinguishable. In various exemplary embodiments, the electrical contact 149 is in a staggered configuration. Because the electrode 143 is between the semiconductor 146 and the dielectric layer 108, the electrode 143 is in a coplanar configuration in these various exemplary embodiments.

Also, in various exemplary embodiments, an encapsulant 145 is located in a space between two or more portions of the via layer 144. Accordingly, FIG. 4 illustrates an exemplary embodiment of an electronic device 140 with a hybrid configuration.

In various exemplary embodiments, the gate electrode 109 is opaque to certain forms of radiation.

Figure 5:
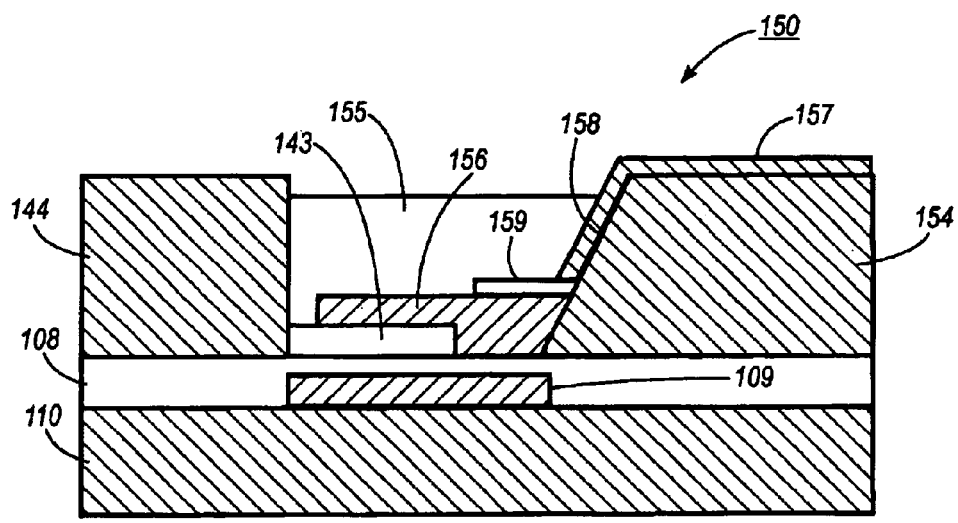
FIG. 5 is a cross section of another exemplary embodiment of an electronic device according to this invention.

FIG. 5 is a cross section of another exemplary embodiment of an electronic device according to this invention. Some of the elements in this figure are commonly numbered with elements previously discussed in connection with other figures. A duplicative discussion of those elements is omitted for the sake of simplicity. The hybrid electronic device 150 includes a via layer portion 154 with a tapered sidewall 158 and a via layer portion 144 without a tapered sidewall.

In various exemplary embodiments of the devices and methods according to this invention, the tapered sidewall 158 allows for easier deposition of the metal electrode along the sidewall of the via layer 154. In various exemplary embodiments, both sidewalls of the via layer are tapered.

In various exemplary embodiments, a semiconductor 156 is formed over a portion of the electrode 143 and over a portion of the dielectric layer 108, and is over a portion of the via layer portion 154. In various exemplary embodiments, a electrode 157 is a metallic electrode formed over a portion of the via layer portion 154 and in contact with an electrical contact 159 which is located over a portion of the semiconductor 156. In various exemplary embodiments, the electrode 157, the electrical contact 159, the semiconductor 156 and the encapsulant 155 have a tapered configuration. Also, in various exemplary embodiments, the encapsulant 155 is located in the space between the via layer portion 144 and the via layer portion 154.

In various exemplary embodiments of the devices and methods according to this invention, the electrode 157 and the electrical contact 159 are made from the same material. In various exemplary embodiments of the devices and methods according to this invention, the electrode 157 and the electrical contact 159 are made from a different material.

Figure 6:
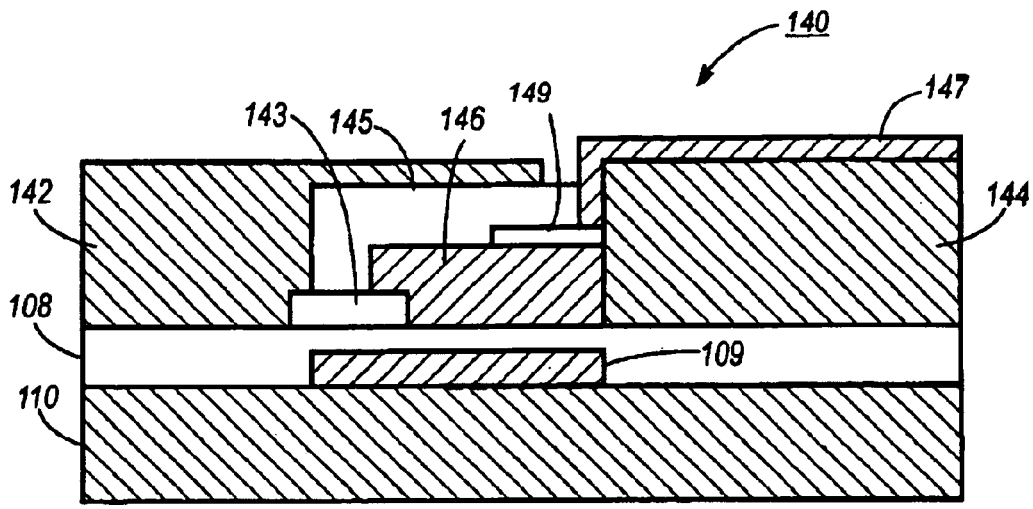
FIG. 6 is a cross section of another exemplary embodiment of an electronic device according to this invention.

FIG. 6 is a cross section of another exemplary embodiment of an electronic device 140 according to this invention. Some of the elements in this figure are commonly numbered with elements previously discussed in connection with other figures. A duplicative discussion of those elements is omitted for the sake of simplicity. The electronic device 140 is a hybrid device and includes a via layer portion 142 that is not self-aligned with the electrode 143. In various exemplary embodiments of the devices and methods according to this invention, the via layer portion 142 partially covers the electrode 143, the dielectric layer 108, the semiconductor 146, and the electrode 149.

Figure 7:
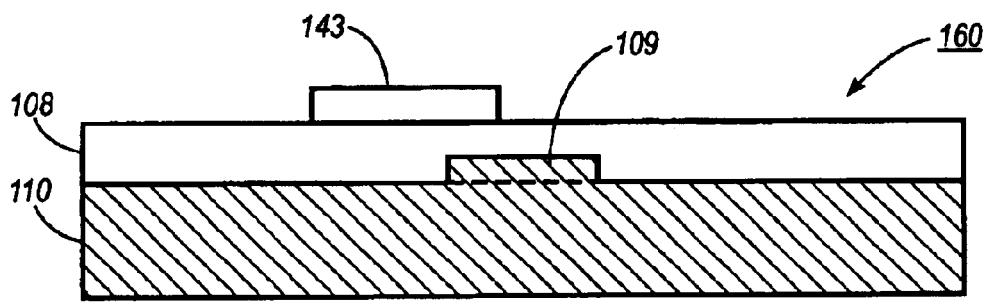
FIGS. 7–13 are cross sections of another exemplary embodiment of an electronic device illustrating an exemplary embodiment of a method of manufacturing an electronic device according to this invention.
Figure 8:
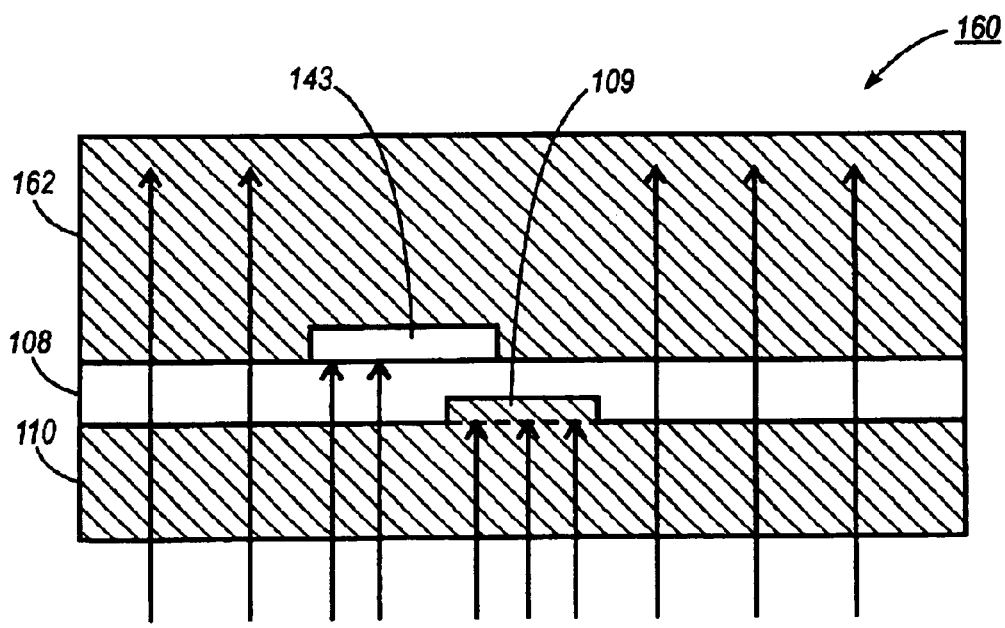

FIGS. 7–13 are cross sections of an electronic device 160 illustrating an exemplary embodiment of a method of manufacturing of an electronic device according to this invention. Some of the elements in these figures are commonly numbered with elements previously discussed in connection with other figures. A duplicative discussion of those elements is omitted for the sake of simplicity. As shown in FIG. 7, for example, in various exemplary embodiments of the devices and methods according to this invention, a substrate 110, the electrode 109, the dielectric layer 108 and an electrode 143 are formed. Then, in various exemplary embodiments of the devices and methods according to this invention, and as illustrated in FIG. 8, for example, a photosensitive liquid via layer 162 is formed over the dielectric layer 108 and the electrode 143.

In various exemplary embodiments of the devices and methods according to this invention, irradiation, such as, for instance, ultraviolet light, is shone on the photosensitive liquid via layer 162, the source electrode 143, the dielectric layer 108, and the substrate 110, and electrode 109. In these exemplary embodiments, the radiation cures the photosensitive liquid via layer 162. In various exemplary embodiments of the methods and devices according to this invention, the radiation is shone from the bottom of the gate electrode 110 as indicated in FIG. 8. This so-called backside exposure allows for the curing of portions of the photosensitive liquid via layer 162 that are not blocked by an opaque body. The electrode 109 is, in various exemplary embodiments, opaque. The substrate 110 is, in various exemplary embodiments, transparent to the radiation. Thus, only certain portions of the photosensitive liquid via layer 162 are subjected to radiation in various exemplary embodiments as indicated by the arrows that pass through to the photosensitive liquid via layer 162 from the gate electrode 109 in FIG. 8.

In various exemplary embodiments of the methods and devices according to this invention, the electrode 143 and the gate electrode 109 are opaque to radiation. In these various exemplary embodiments of the methods and devices according to this invention, a portion of the photosensitive liquid via layer 162 is located above the electrode 143, or above the gate electrode 109, or both. In these various exemplary embodiments, that portion of the photosensitive liquid via layer 162 is not cured by the radiation. In these various exemplary embodiments, the electronic device 160 is said to be self-aligned.

Figure 9:
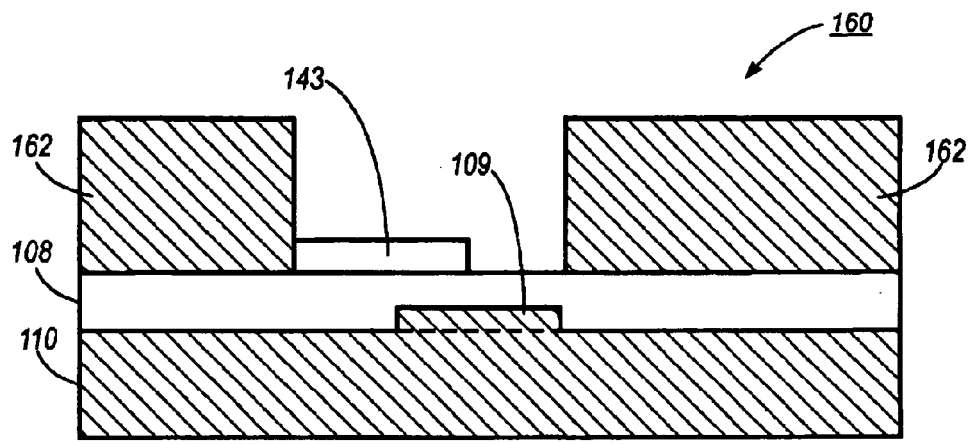

In various exemplary embodiments of the devices and methods according to this invention, after curing is performed, some uncured material is removed as shown, for example, in FIG. 9. In various exemplary embodiments of the devices and methods according to this invention, this occurs, for instance, by solvent washing. Accordingly, in these exemplary embodiments, the portion of the photosensitive liquid via layer 162 that is above the source electrode 143 and above the top portion 109 of the gate electrode 110 is uncured. This portion of the photosensitive liquid via layer 162 is to be removed.

As illustrated in FIG. 9, for example, the resultant structure, in these various exemplary embodiments of the devices and methods of this invention, has a gate electrode 110 on which a dielectric layer 108 is formed. An electrode 143 is formed over the dielectric layer 108, and more than one portion of the via layer 162 is formed and cured over the dielectric layer 108. In these various exemplary embodiments, the portion of the dielectric layer 108 that is covered by the electrode 143 and the portion of the dielectric layer 108 that covers the top portion 109 of the gate electrode 110 is uncovered and provides a recess in the cured portion of the via layer 162.

Figure 10:
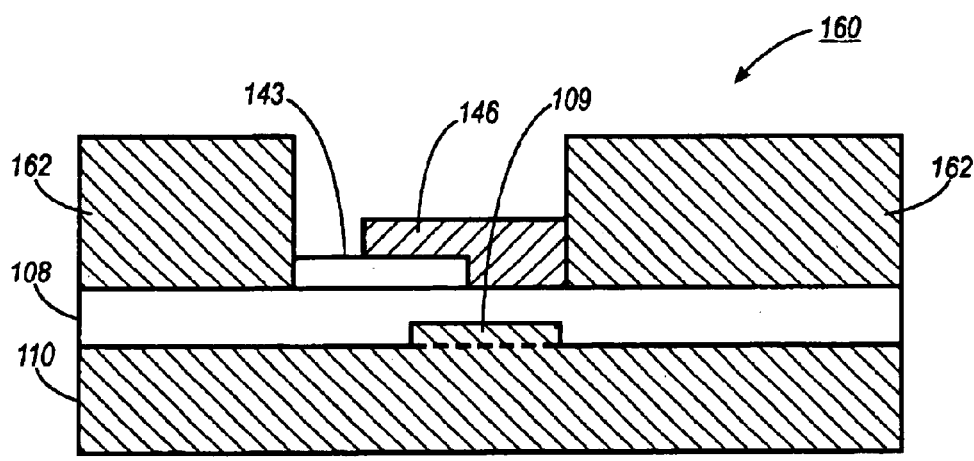

In various exemplary embodiments of the devices and methods according to this invention, and as illustrated in FIG. 10, for example, a semiconductor 146 is formed in a portion of the recess of the via layer 162 and covers a portion of the dielectric layer 108 and a portion of the electrode 143.

Figure 11:
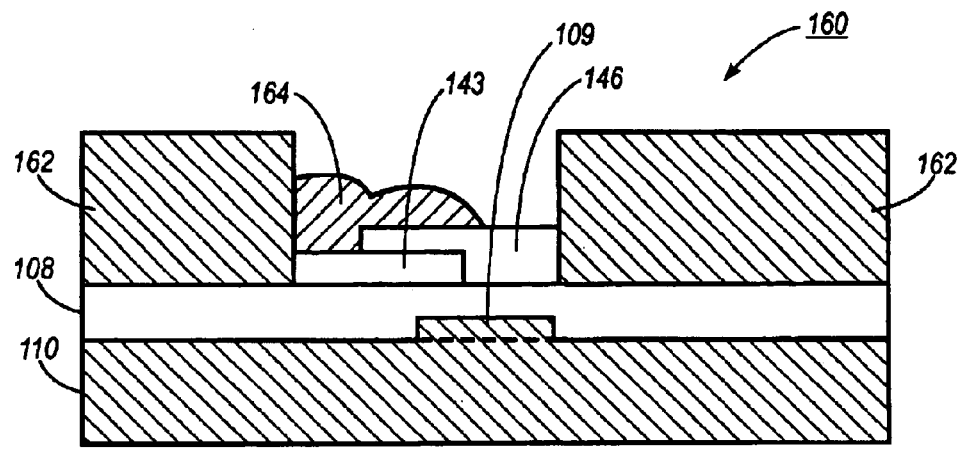
Figure 12:
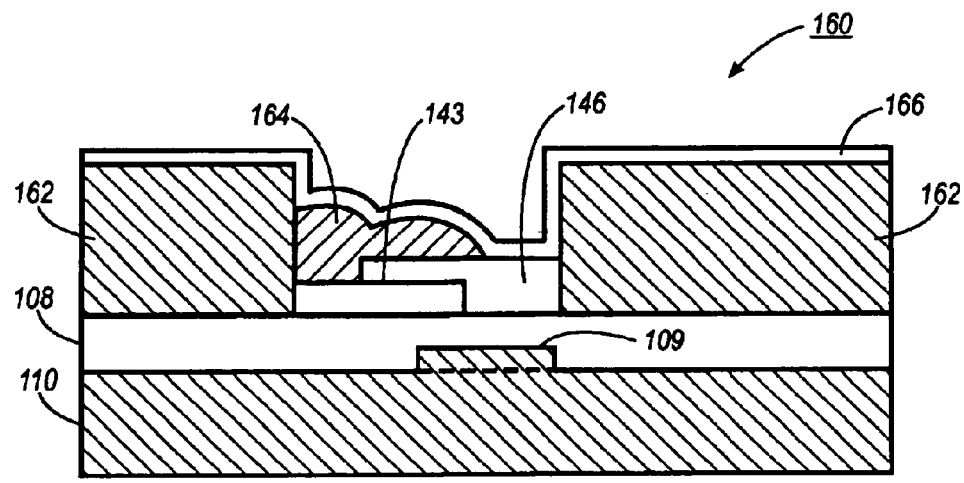
Figure 14:
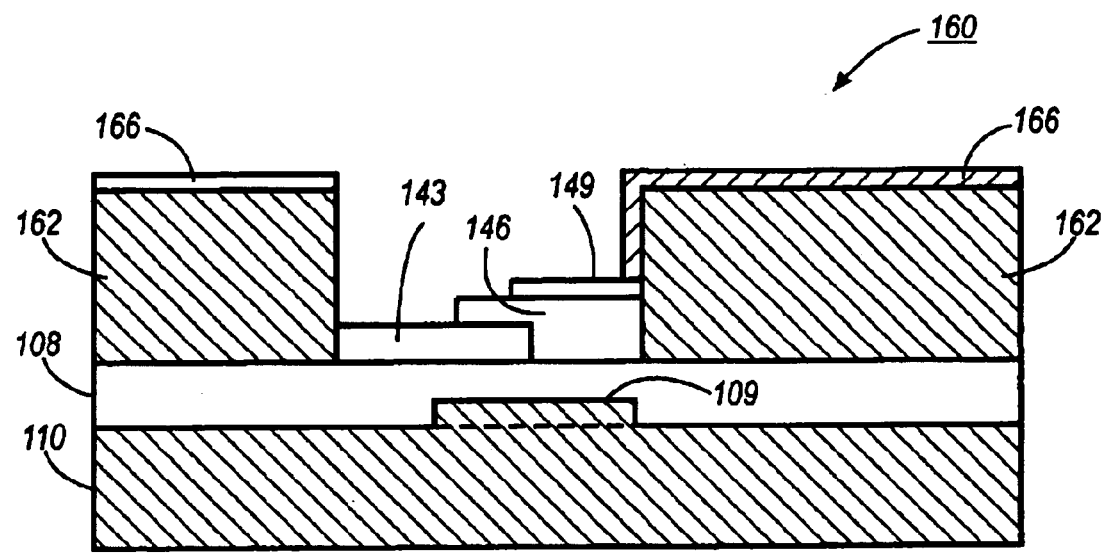
FIG. 14 is a cross section of another exemplary embodiment of an electronic device according to this invention.

In various exemplary embodiments of the devices and methods according to this invention, and as illustrated in FIG. 11, for example, a mask 164 is formed over a portion of the semiconductor 146 and over the portion of the electrode 143 that is not covered by the semiconductor 146. In various exemplary embodiments, the mask 164 is printed. Accordingly, and as illustrated in FIG. 12, in various exemplary embodiments of the devices and methods of this invention, for example, a metal layer 166 is deposited over the entire electronic device 160 and covers all portion of the via layer 162, an uncovered portion of the semiconductor 146 and the print resist 164. The metal layer 166 so deposited constitutes an electrode. Referring to FIG. 14, in various exemplary embodiments, an electrical device 190 includes an electrical contact 149 deposited on a portion of the semiconductor layer 146. In various exemplary embodiments, the metal layer 166 is deposited over the electrical contact 149.

In various exemplary embodiments of the devices and methods according to this invention, the metal layer 166 is formed directly over the via layer 162 and over a portion of the semiconductor 146, for instance, by printing. In various exemplary embodiments of the devices and methods according to this invention, printing the metal layer 166 avoids using a mask such as, for example, the mask 164 illustrated in FIGS. 11–12, that needs to be subsequently removed.

Figure 13:
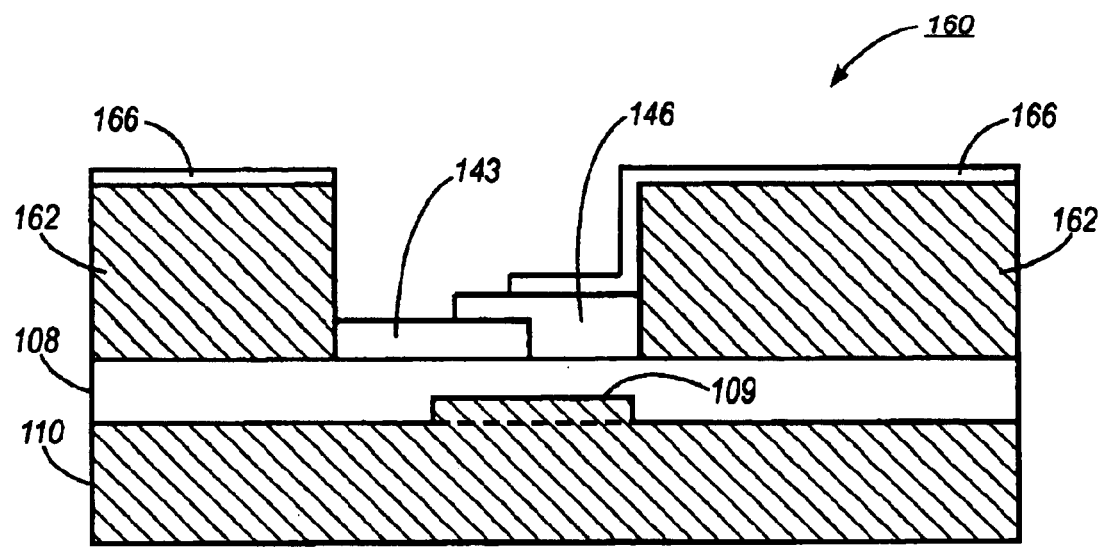

In various exemplary embodiments of the devices and methods of this invention, and as illustrated in FIGS. 13 and 14, for example, the print resist 164 is removed, thus uncovering the portion of the semiconductor 146 that is not covered by the electrode 166 or the electrical contact 149 and uncovering the portion of the electrode 143 that is not covered by the semiconductor 146. In various exemplary embodiments of the methods and devices according to this invention, the resulting structure, as illustrated in FIGS. 13 and 14, for example, is an electronic device 160 or 190 with a hybrid configuration where at least a portion of the electrode 143 is located under the semiconductor 146, and where at least a portion of the electrode 166 is located over the semiconductor 146.

Figure 15:
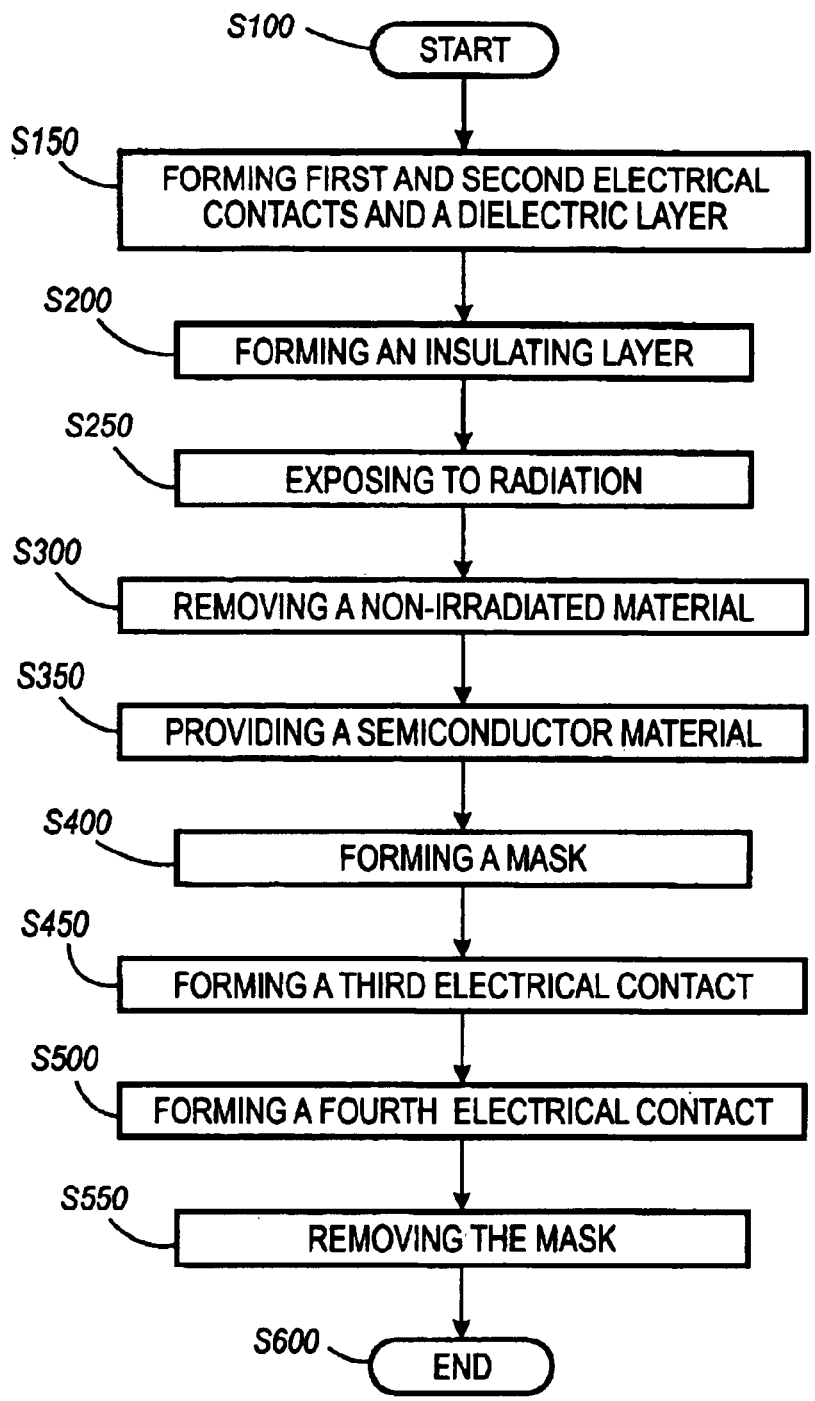
FIG. 15 is a flow chart describing an exemplary embodiment of a method of fabrication of an electronic device according to this invention.

FIG. 15 is a flow chart describing an exemplary embodiment of a method of fabrication of an electronic device according to this invention. In various exemplary embodiments according to this invention, the fabrication method starts in step S100, then continues to step S150, where a first and second electrical contacts are formed, along with a dielectric layer. In various exemplary embodiments according to this invention, the dielectric layer is located between the first and the second electrical contacts. In various exemplary embodiments according to this invention, the first electrical contact is a gate electrode.

In various exemplary embodiments according to this invention, the second electrical contact is in a coplanar configuration with the semiconductor material.

Next, in step S200, an electrically insulating layer is formed. In various exemplary embodiments according to this invention, the electrically insulating layer is formed over the dielectric layer and the first electrical contact. Next, in step S250, in various exemplary embodiments according to this invention, the first and second electrical contacts, the dielectric layer and a portion of the electrically insulating layer are exposed to radiation. In various exemplary embodiments according to this invention, the radiation comes from the side of the first electrical contact.

In various exemplary embodiments according to this invention, the radiation to which the electrical device is subjected to is ultraviolet light.

Next, in step S300, a portion of the electrically insulating layer that is not irradiated by the radiation is removed. Next, in step S350, a semiconductor material is provided. In various exemplary embodiments according to this invention, the semiconductor material is provided over a portion of the dielectric layer that is not covered by the electrically insulating layer.

In various exemplary embodiments according to this invention, removing of the portion of the electrically insulating layer that was not irradiated by the radiation is performed by solvent washing.

In various exemplary embodiments according to this invention, the removal of the portion of the electrically insulating layer creates a tapered wall.

In various exemplary embodiments according to this invention, the semiconductor material is printed over the portion of the dielectric layer that is not covered by the electrically insulating layer.

Next, in step S400, a mask is formed. In various exemplary embodiments according to this invention, the mask is formed over the second electrical contact and a portion of the semiconductor material. In various exemplary embodiments according to this invention, the mask prevents the second electrical contact and a portion of the semiconductor material from being in contact with any other material during subsequent steps of this method.

In various exemplary embodiments according to this invention, the mask is a printed resist.

In various exemplary embodiments according to this invention, where the semiconductor material is printed, no mask is formed.

Next, in step S450, a third electrical contact is formed. In various exemplary embodiments according to this invention, the third electrical contact is formed over at least a portion of the electrically insulating layer, the semiconductor material and the mask. Next, in step S500, a fourth electrical contact is formed over a portion of the third electrical contact and electrically insulating layer.

In various exemplary embodiments according to this invention, the third electrical contact is formed via vapor deposition.

In various exemplary embodiments according to this invention, the third and the fourth electrical contacts are made of the same material.

In various exemplary embodiments according to this invention, step S500 is omitted.

Next, in step S550, the mask is removed. In various exemplary embodiments according to this invention, where the semiconductor material is a solution processable semiconductor and is printed and no mask is formed, no mask is removed. Control then proceeds to step S600, where the method ends.

This invention has been described in conjunction with the exemplary embodiments outlined above. Various alternatives, modifications, variations, and/or improvements, are within the spirit and scope of the invention whether known or presently unforeseen. Accordingly, the exemplary embodiments of the invention, as set forth above, are intended to be illustrative, not limiting. Various changes may be made without departing from the spirit and scope of the invention. Therefore, the invention is intended to embrace all known or later developed alternatives, modifications, variations and/or improvements.

What is claimed is:

1. A method of fabricating an electronic device, comprising:

forming a first electrical contact, a dielectric layer and a second electrical contact, wherein the dielectric layer is located between the first and the second electrical contacts;

forming an electrically insulating layer over the dielectric layer and the first electrical contact;

exposing the second electrical contact, the dielectric layer, the first electrical contact and a first portion of the electrically insulating layer to radiation from the side of the first electrical contact;

removing a second portion of the electrically insulating layer that was not irradiated by the radiation;

providing a semiconductor material over a portion of the dielectric layer that is not under the electrically insulating layer;

forming a mask over the second electrical contact and a portion of the semiconductor material;

forming a third electrical contact over at least a portion of the electrically insulating layer, the semiconductor material and the mask;

forming a fourth electrical contact over at least a portion of the third electrical contact and the electrically insulating layer; and removing the mask.

2. The method of claim 1, wherein exposing the second electrical contact, the dielectric layer, the first electrical contact and a first portion of the electrically insulating layer comprises exposing the second electrical contact, the dielectric layer, the first electrical contact and a first portion of the electrically insulating layer to ultraviolet light.

3. The method of claim 1, wherein removing the second portion of the electrically insulating layer that was not irradiated by the radiation comprises solvent washing the second portion of the electrically insulating layer that was not irradiated by the radiation.

4. The method of claim 1, wherein providing the semiconductor material over a portion of the dielectric layer that is not under the electrically insulating layer comprises printing a solution processable semiconductor over a portion of the dielectric layer that is not under the electrically insulating layer.

5. The method of claim 1, wherein forming the third electrical contact over at least a portion of the electrically insulating layer, the semiconductor and the mask comprises chemical vapor depositing the third electrical contact over at least a portion of the electrically insulating layer, the semiconductor and the mask.

6. The method of claim 1, wherein the mask is a printed resist.

7. The method of claim 1, wherein removing the second portion of the electrically insulating layer that was not irradiated by the radiation creates a tapered sidewall.

8. The method of claim 1, wherein forming the second electrical contact comprises forming the second electrical contact in a coplanar configuration with the semiconductor material, and forming the third electrical contact comprises forming the third electrical contact in a staggered configuration with the semiconductor material.

9. A method of fabricating an electronic device, comprising:

forming a first electrical contact, a dielectric layer and a second electrical contact, wherein the dielectric layer is located between the second electrical contact and the first electrical contact;

forming a electrically insulating layer over the dielectric layer and the first electrical contact;

exposing the second electrical contact, the dielectric layer, the first electrical contact and a first portion of the electrically insulating layer to radiation from the side of the first electrical contact;

removing a second portion of the electrically insulating layer that was not irradiated by the radiation;

providing a semiconductor material over a portion of the dielectric layer that is not under the electrically insulating layer;

forming a third electrical contact over at least a portion of the electrically insulating layer and at least a portion of the semiconductor, and forming a fourth electrical contact over at least a portion of the third electrical contact and the electrically insulating layer.

* * * * *

UNITED STATES PATENT AND TRADEMARK OFFICE
CERTIFICATE OF CORRECTION

| | | |
|---|---|---|
| PATENT NO. | : 6,921,679 B2 | Page 1 of 1 |
| APPLICATION NO. | : 10/739189 | |
| DATED | : July 26, 2005 | |
| INVENTOR(S) | : Michael L. Chabinyc et al. | |

It is certified that error appears in the above-identified patent and that said Letters Patent is hereby corrected as shown below:

Column 1, line 4, insert as a new paragraph:

This invention was made with Government support under 70NANB0H3033 awarded by NIST/ATP. The Government has certain rights in this invention.

Signed and Sealed this

First Day of May, 2007

JON W. DUDAS
*Director of the United States Patent and Trademark Office*